United States Patent
Caskey et al.

(10) Patent No.: US 8,742,602 B2
(45) Date of Patent: Jun. 3, 2014

(54) VERTICAL ELECTRICAL INTERCONNECT FORMED ON SUPPORT PRIOR TO DIE MOUNT

(75) Inventors: Terrence Caskey, Santa Cruz, CA (US); Lawrence Douglas Andrews, Jr., Los Gatos, CA (US); Scott McGrath, Scotts Valley, CA (US); Simon J. S. McElrea, Scotts Valley, CA (US); Yong Du, Cupertino, CA (US); Mark Scott, Monte Sereno, CA (US)

(73) Assignee: Invensas Corporation, San Jose, CA (US)

( * ) Notice: Subject to any disclaimer, the term of this patent is extended or adjusted under 35 U.S.C. 154(b) by 140 days.

(21) Appl. No.: 12/046,651

(22) Filed: Mar. 12, 2008

(65) Prior Publication Data
US 2008/0224279 A1  Sep. 18, 2008

Related U.S. Application Data (60) Provisional application No. 60/895,305, filed on Mar. 16, 2007.

(51) Int. Cl.
| | | |
|---|---|---|
| H01L 23/48 | (2006.01) | |
| H01L 23/52 | (2006.01) | |
| H01L 29/40 | (2006.01) | |

(52) U.S. Cl.
USPC ............... 257/786; 257/E23.021; 257/686; 257/689; 438/612; 438/666

(58) Field of Classification Search
CPC .................................................. H01L 2924/14
USPC ........... 257/E21.506, E23.023, E23.031, 666, 257/685, 686, 723, 746, 690, 693, 696, 737, 257/777–781, E23.021, E23.078, E21.515, 257/661, 676, 689, 786; 438/109, 108, 411, 438/461, 611–614, 123, 666
See application file for complete search history.

(56) References Cited

U.S. PATENT DOCUMENTS

| | | | |
|---|---|---|---|
| 4,336,551 A | | 6/1982 | Fujita et al. |
| 4,363,076 A | * | 12/1982 | McIver .......................... 361/718 |
| 4,784,972 A | * | 11/1988 | Hatada ....................... 228/180.21 |
| 5,107,325 A | * | 4/1992 | Nakayoshi ..................... 257/793 |

(Continued)

FOREIGN PATENT DOCUMENTS

KR  10-19970030530 A  6/1997

OTHER PUBLICATIONS

International Search Report for Application No. PCT/US2008/056633 dated Aug. 14, 2008.

*Primary Examiner* — Chris Chu
(74) *Attorney, Agent, or Firm* — Lerner, David, Littenberg, Krumholz & Mentlik, LLP (57) ABSTRACT

A die assembly includes a die mounted to a support, in which the support has interconnect pedestals formed at bond pads, and the die has interconnect terminals projecting beyond a die edge into corresponding pedestals. Also, a support has interconnect pedestals. Also, a method for electrically interconnecting a die to a support includes providing a support having interconnect pedestals formed at bond pads on the die mount surface of the support, providing a die having interconnect terminals projecting beyond a die edge, positioning the die in relation to the support such that the terminals are aligned with the corresponding pedestals, and moving the die and the support toward one another so that the terminals contact the respective pedestals.

20 Claims, 8 Drawing Sheets

(56) References Cited

U.S. PATENT DOCUMENTS

| | | | |
|---|---|---|---|
| 5,138,438 A * | 8/1992 | Masayuki et al. | 257/686 |
| 5,731,631 A * | 3/1998 | Yama et al. | 257/702 |
| 5,737,191 A * | 4/1998 | Horiuchi et al. | 361/764 |
| 6,087,716 A * | 7/2000 | Ikeda | 257/676 |
| 6,175,158 B1 | 1/2001 | Degani et al. | |
| 6,262,476 B1 * | 7/2001 | Vidal | 257/686 |
| 6,315,856 B1 * | 11/2001 | Asagiri et al. | 156/277 |
| D475,981 S * | 6/2003 | Michii | D13/182 |
| 6,580,165 B1 * | 6/2003 | Singh | 257/696 |
| 6,593,648 B2 * | 7/2003 | Emoto | 257/696 |
| 6,670,701 B2 * | 12/2003 | Matsuura et al. | 257/686 |
| 6,802,446 B2 * | 10/2004 | Chaudhuri et al. | 228/248.1 |
| 7,190,060 B1 * | 3/2007 | Chiang | 257/686 |
| 7,408,243 B2 * | 8/2008 | Shiffer | 257/666 |
| 7,601,039 B2 * | 10/2009 | Eldridge et al. | 439/894 |
| 7,732,912 B2 * | 6/2010 | Damberg | 257/696 |

\* cited by examiner

VERTICAL ELECTRICAL INTERCONNECT FORMED ON SUPPORT PRIOR TO DIE MOUNT

RELATED APPLICATION

This application is related to, and claims priority from, U.S. Provisional Patent Application No. 60/895,305 filed Mar. 16, 2007, which is incorporated herein by reference.

BACKGROUND

This invention relates to electrical interconnection of integrated circuit chips and, particularly, to interconnection of assemblies including one or more integrated circuit chips.

Interconnection of stacked die with the substrate presents a number of challenges.

Some die as provided have die pads along one or more of the die margins, and these may be referred to as peripheral pad die. Other die as provided have die pads arranged in one or two rows near the center of the die, and these may be referred to as center pad die. The die may be "rerouted" to provide a suitable arrangement of interconnect pads at or near one or more of the margins of the die.

SUMMARY

In various general aspects the invention features methods for electrical interconnection of stacked die with a support, and assemblies made by the methods.

In one general aspect the invention features a support having interconnect pedestals formed at bond sites on the die mount surface of the support. The bond sites are arranged near at least one edge of the location of a footprint of a die to be mounted on the support. Interconnect terminals on the die project beyond a die edge, and the pedestals are arranged at the bond sites so that when the die is moved toward the die mount region of the support the interconnect terminals contact the corresponding pedestals.

The support may be any of a variety of supports having sites for electrical connection of semiconductor devices. For example, the support may be a package substrate or a circuit board, such as a printed circuit board, and the bond sites may be bond pads at the die mount surface of the substrate or circuit board; or, for example, the support may be a lead frame, and the bond sites may be connection sites on lead fingers of the lead frame.

In another general aspect the invention features a method for electrically interconnecting a die to a support, by steps of providing a support having interconnect pedestals formed at bond sites on the die mount surface of the support, providing a die having interconnect terminals projecting beyond a die edge, positioning the die in relation to the support such that the terminals are aligned with the corresponding pedestals, and moving the die toward the support (or the support toward the die) so that the terminals contact the respective pedestals.

The pedestals may be constructed of any of a variety of electrically conductive materials. In some embodiments the material is a curable or settable material, and the material is electrically conductive when set or cured. The material may be applied to the bond sites in an uncured form and then cured or permitted to set following the die mount. The material may be partially cured following application and prior to contacting the interconnect terminals with the pedestals. In some embodiments the pedestal material in an uncured or partially cured state is sufficiently firm to maintain a suitable height and form during die mount; in some embodiments the pedestal material in an uncured or partially cured state is sufficiently deformable to permit penetration of the interconnect terminals during die mount.

In some embodiments the pedestal material includes a matrix containing an electrically conductive filler; the matrix may be a curable or settable material, and the electrically conductive fill may be in particulate form, for example, such that when the matrix sets or is cured, the pedestal is itself electrically conductive. The matrix may be, for example, an organic polymer such as an epoxy. The pedestal material may be, for example, a conductive epoxy such as a filled epoxy.

In some embodiments the procedure of positioning the die includes positioning at least one additional die in relation to the support such that the terminals are aligned with the corresponding pedestals, and moving the additional die toward the support (or the support toward the die) so that the terminals contact the respective pedestals. In some such embodiments die and the additional die may be mounted one onto another to form a die stack, and the die stack is then mounted onto the support by positioning the die stack in relation to the support such that the terminals are aligned with the corresponding pedestals, and moving the die stack toward the support (or the support toward the die stack) so that the terminals contact the respective pedestals. In other such embodiments the die are mounted serially over the support; that is, a first die is mounted onto the support and then an additional die is positioned such that the terminals on the additional die are aligned with the corresponding pedestals, and the additional die is moved toward the support (or the support toward the die) and mounted onto the subjacent die so that the terminals contact the respective pedestals; if a die stack greater than two die is desired, then this procedure is repeated with further additional die until the desired stack number is reached.

In another general aspect the invention features a die assembly including a die mounted to a support, the support having interconnect pedestals formed at bond sites, and the die having interconnect terminals projecting beyond a die edge into corresponding pedestals. In some embodiments two or more die are stacked together, each having interconnect terminals projecting beyond a die edge into corresponding pedestals.

The assemblies according to the invention can be used for building computers, telecommunications equipment, and consumer and industrial electronics devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention.

Figure 1:
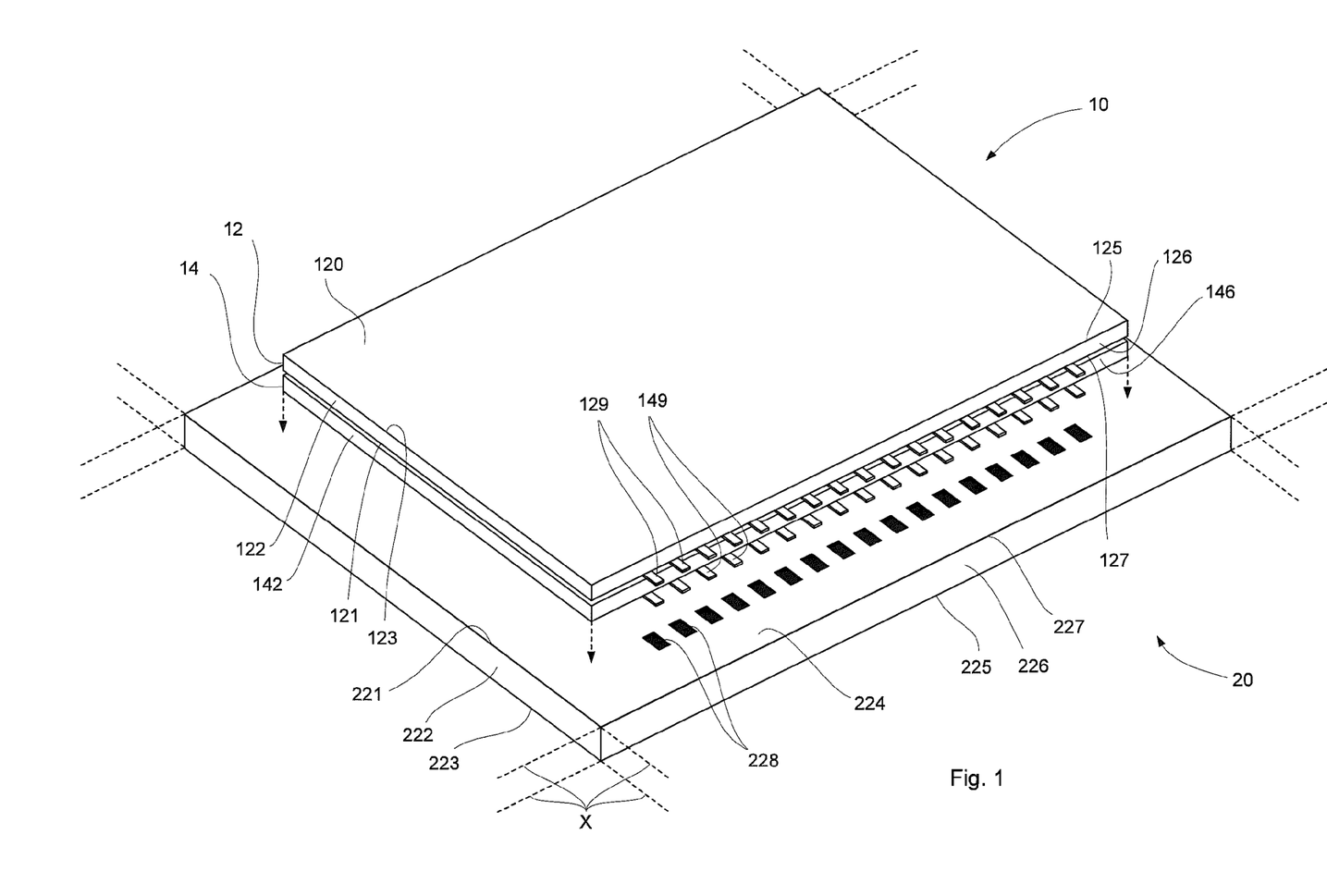
FIG. 1 is a diagrammatic sketch in a perspective view showing a two-die stack assembly in relation to a substrate to which the assembly is to be mounted.

Turning now to FIG. 1, there is shown in a perspective view a stack 10 of two semiconductor die 12, 14, to be mounted a substrate, indicated generally at 20. Each die has two larger generally parallel, generally rectangular (for example square) sides, and four edges. One larger side may be referred to as the front side, and the other may be referred to as the back side. The circuitry of the die is situated at or near the die surface at the front side, and so the front side may be referred to as the active side of the die. In the view presented in FIG. 1 the die are shown with the respective active sides facing toward the substrate 20, so that the back side 120 of die 12 is visible, such a configuration may be referred to as a "die-down" orientation. Alternatively, one or more of the die can be arranged with the active side facing away from the substrate, which may be referred to as a "die-up" orientation. Also visible in the view shown in FIG. 1 are edges 122, 126 of die 12 and edges 142, 146 of die 14. Margins of the die are adjacent the edges; for example, margins 125 and 123 are adjacent the edges 126 and 122 on the back side of die 12, and margins 127 and 121 are adjacent the edges 126 and 122 on the front side of die 12. Interconnect terminals 129 are bonded to interconnect pads in or near the margin 127 at the active side of die 12, and interconnect terminals 149 are bonded to interconnect pads in or near the margin at the active side of die 14. The interconnect terminals project outward beyond the die edge in the embodiments shown in the FIGs.

Figure 2:
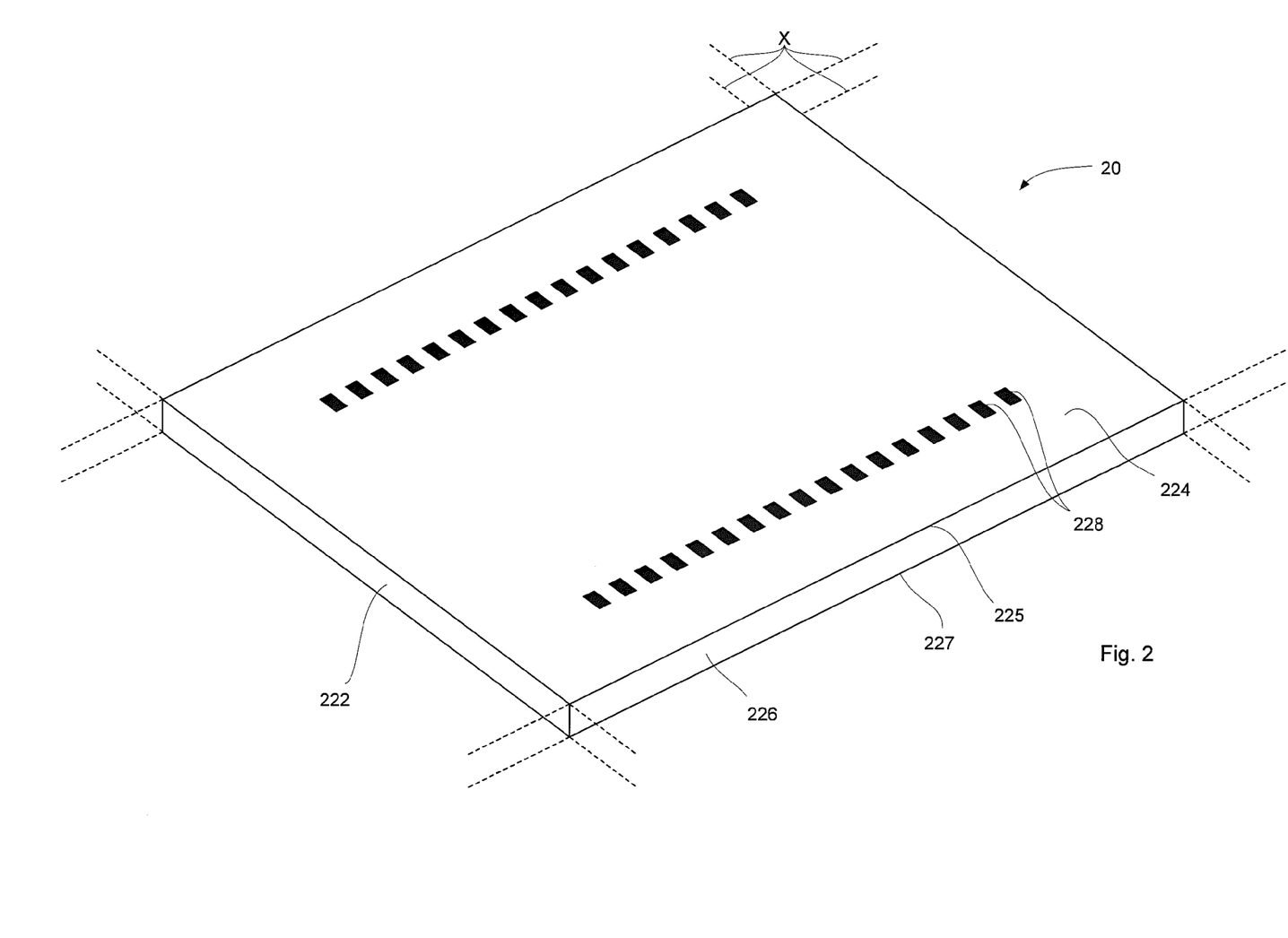
FIG. 2 is a diagrammatic sketch in a perspective view showing a substrate as in FIG. 1.

The substrate 20, shown also in FIG. 2, has a die attach side 224, on which bond pads 228 are situated. A number of substrates 20 may be provided in a row or array, as suggested by the broken lines X; at some stage in the process, the substrates are separated, for example by sawing or punching. Each substrate has edges, of which edge 226 and 222 are visible in the view shown in FIGS. 1 and 2; and margins of the substrate are adjacent the substrate edges; for example margins 227 and 221 are adjacent the edges 226 and 222 on the die attach side 224 of the substrate 20, and margins 225 and 223 are adjacent the edges 226 and 222 on the obverse side of the substrate 20.

In the embodiment shown by way of example in FIGS. 1 and 2, the bond pads 228 are arranged in two rows, one generally parallel to the margin 227 and one generally parallel to the opposite margin. The locations of the bond pads correspond to the locations of the interconnect terminals on the die, when the die is mounted onto the substrate. Accordingly, the interconnect pads on the die in the examples illustrated in these examples are arranged along two opposite margins. Other arrangements of bond pads are contemplated, according to the arrangements of pads on the particular die. In other embodiments the interconnect pads on the die may be situated along one die margin, or along three or all four margins; and the bond pads on the substrate in such embodiments are arranged correspondingly. Bond pads on the substrate may be arranged in two or more rows of pads along any one or more boundaries of the die footprint; and the bond pads may be interdigitated. In some embodiments, certain of the pads on a given die may not be connected to other die in the stack; for example, "chip select" or "chip enable" pads on a given die may be connected to underlying circuitry (on the substrate, for example), but not to other die. In such embodiments the terminals from such pads may connect by way of pedestals in a second row along an edge of the die.

Figure 3:
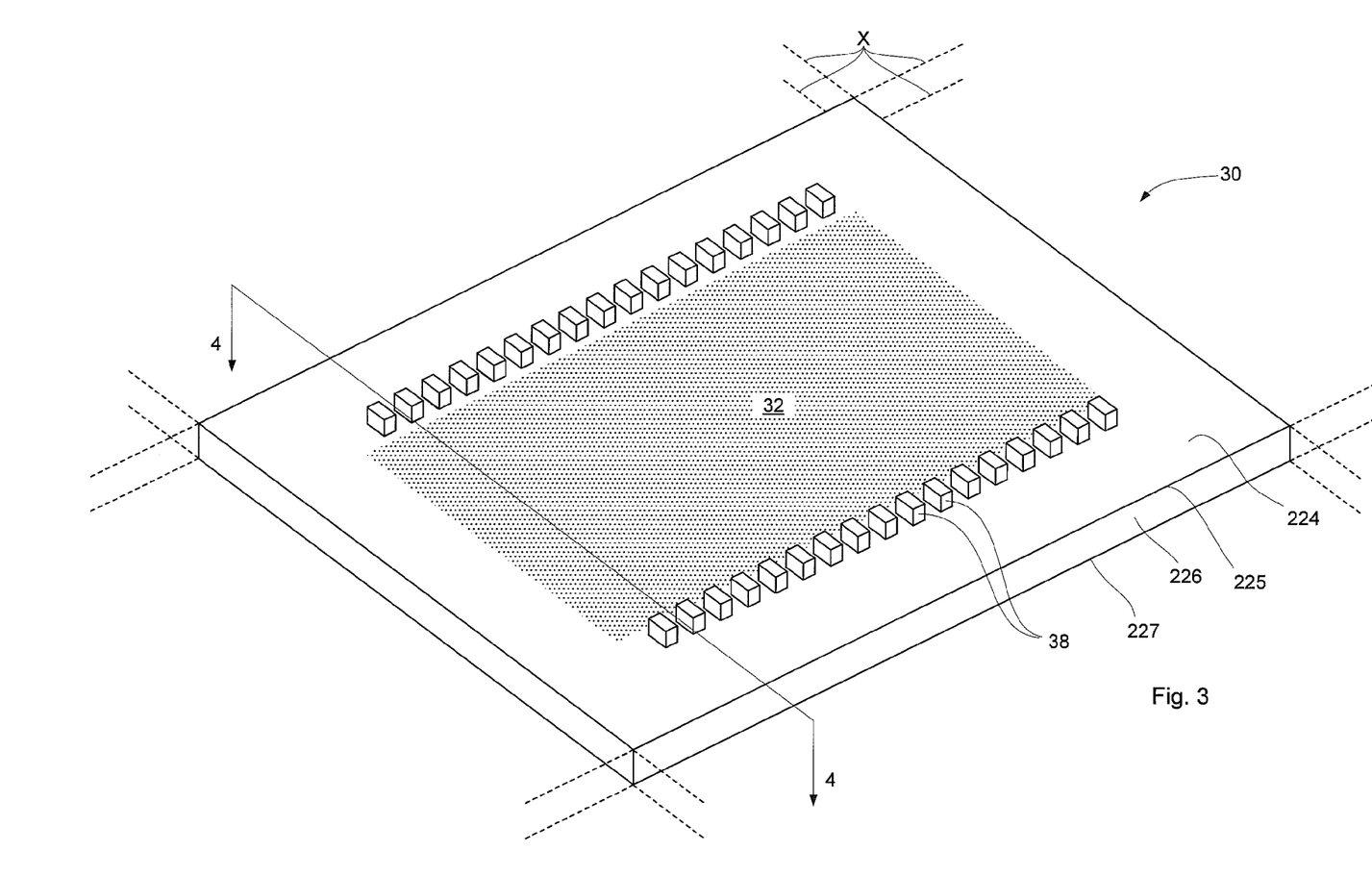
FIG. 3 is a diagrammatic sketch in a perspective view showing electrical interconnect pedestals mounted on a substrate according to an embodiment of the invention.

Referring now to FIG. 3, a substrate is shown generally at 30, provided with interconnect pedestals 38 according to an embodiment of the invention. The die footprint is indicated at 32. The pedestals 38 are formed at bond pads (not visible in FIG. 3; see FIG. 2) situated on the die attach side 224 of the substrate, and the locations of the pedestals correspond to locations of the interconnect terminals on the die adjacent the boundary of the die footprint. In some embodiments the pedestals are situated at some remove from the boundary of the die footprint, so that the die does not impinge on the pedestals during die mount. Some tolerance is required, depending upon the precision of the equipment; generally the distance between the pedestals and the boundary of the die footprint may be in a range about 3-5 mils.

The pedestals may be constructed of any of a variety of electrically conductive materials. The material of the pedestals in some embodiments is sufficiently firm to maintain a suitable height and form during the die mount steps. And the material of the pedestals in some embodiments is sufficiently deformable to permit penetration of the interconnect terminals. The pedestals may be constructed of a material including a matrix containing an electrically conductive filler; the matrix may be a curable or settable material, and the electrically conductive fill may be in particulate form, for example, such that when the matrix sets or is cured, the pedestal is itself electrically conductive. The matrix may be, for example, an organic polymer such as an epoxy. In some embodiments the pedestals are formed of a conductive epoxy such as, a silver filled epoxy; for example, a filled epoxy having 60-90% (more usually 80-85%) silver may be suitable. The epoxy is cured following die mount.

The pedestals may be formed in any of a variety of shapes, and no particular shape is required. An appropriately located dot or puddle may be suitable. Whatever the form of the pedestal, it may be described as having a footprint and a height. The footprint may be round or generally rectangular, for example. Generally, a pedestal having an elongate footprint may be capable of maintaining a greater height; accordingly, for example, a pedestal having an elliptical or oval footprint may be more suitable than one having a circular footprint; and, for example, a pedestal having an elongate rectangular footprint may be more suitable than one having a square footprint. Adjacent pedestals in a row having an elongated footprint may be situated close together by orienting the longer dimension of the pedestal footprint generally perpendicular to the boundary of the die footprint. The top of the pedestal need not be as large as, nor have the same shape as, the footprint. The pedestals are pictured in the FIGs. as being shaped as a rectangular solid; but in practice the corners may be rounded to some extent.

As will be appreciated, the pedestal may be deformed to some extent as it is penetrated by the interconnect terminal during die mount. Particularly, the pedestal as deposited may collapse downward as the terminal is pressed onto or into it; and, as the pedestal material is deformed, the footprint dimension may increase accordingly.

The dimensions of the pedestals can be selected according to the height of the die or die stack; and according to whether the die are oriented facing away from or toward the support; and according to whether the interconnect terminals are angled toward the substrate; and according to the rheologic characteristics of the pedestal material. The height of the pedestal as deposited must be at least great enough so that each corresponding interconnect terminal makes good contact with the pedestal, and so that, following cure or set of the terminal material, good and reliable electrical continuity is maintained with each corresponding interconnect terminal. Where there are a greater number of die in the stack, the pedestal height must be greater. In some embodiments, the pedestal as deposited is at least as high as the thickness (in a plane perpendicular to the support) of the projecting end of the interconnect terminal; for example, if the interconnect terminal has a thickness about 1 mil, then the height of the pedestal as deposited must be at least 1 mil. In some embodiments the interconnect terminal has a thickness about % the thickness of the die nearest the support, or about ½ the thickness of the die nearest the support.

Additionally, a pedestal may be more readily penetrated by the terminal during die mount, without collapsing excessively, if the pedestal width is greater than width of the penetrating part of the terminal. A pedestal having a greater height may require a larger footprint to maintain form during die mount. In some embodiments the pedestals are about 1.5 times as long as wide, and in particular embodiments the pedestals have a generally rectangular footprint about 10 mil wide and about 15 mil long, with the longer dimensions oriented generally perpendicular to the boundary of the die footprint. Pedestals having these dimensions, and made of a filled epoxy such as Lord MD140 may have a height as great as a range about 5-6 mils, for example, and may sufficiently maintain form during penetration by terminals having a width about 5 mils. It may be preferred in some embodiments that the pedestal following die mount and cure or set have a height no greater than the overall height of the die stack and, in many embodiments the pedestal height may be significantly less than the overall height of the die stack, provided that each of the corresponding interconnect terminals makes good electrical contact with the finished pedestal.

The pedestals may be formed by any of a variety of techniques, such as screen print or stencil print or liquid dispense, for example. The pedestal material my be a curable material and, depending upon the material and the technique, the pedestal material may be deposited in an uncured or partially cured state, and the material may be partially or additionally cured during die mount, and may be fully cured when die placement has been completed.

Figure 4:
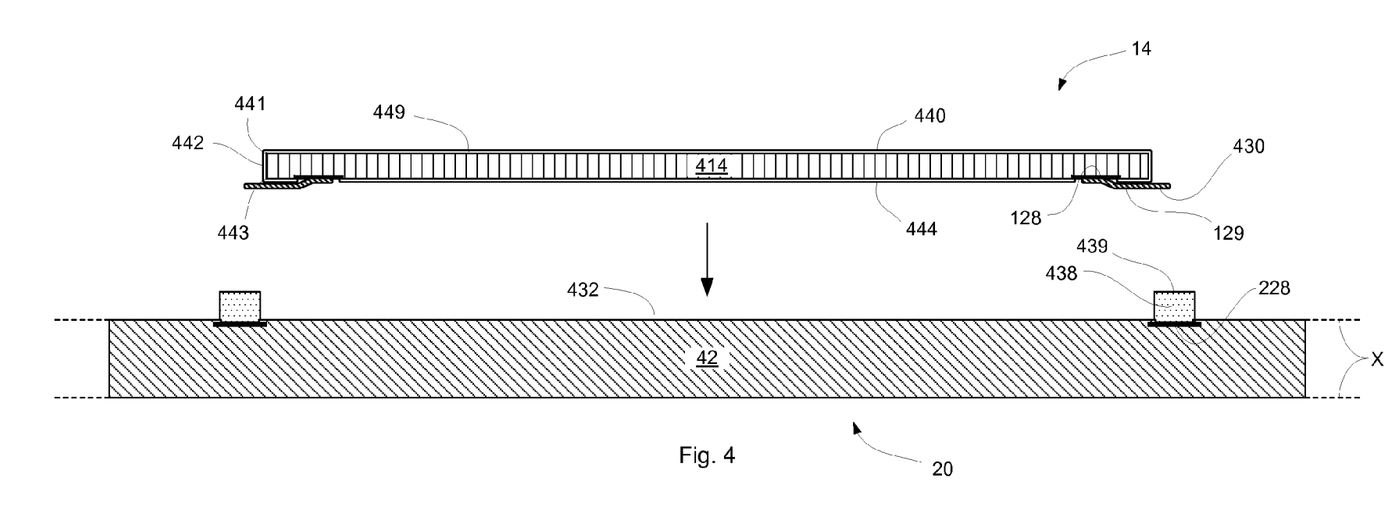
FIG. 4 is a diagrammatic sketch in a sectional view as indicated at 4-4 in FIGS. 3 and 10, showing a substrate having electrical interconnect pedestals mounted on a substrate as in FIG. 4, and a die to be mounted on the substrate and electrically interconnected by way of the pedestals.
Figure 5:
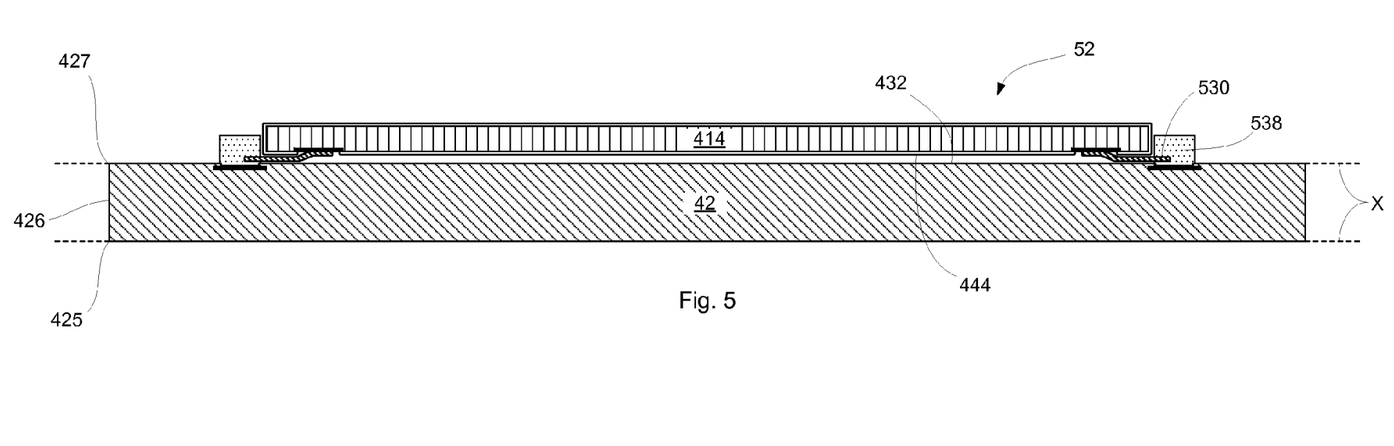
FIG. 5 is a diagrammatic sketch in a sectional view as indicated at 5-5 in FIG. 9, showing a die mounted on a substrate according to an embodiment of the invention.

FIGS. 4 and 5 are diagrams in sectional view showing mount of a die 14 onto a substrate 20 according to an embodiment of the invention. The substrate 20 includes a substrate body 42 having bond pads 228 exposed for interconnection at a die attach side 432. Any of a variety of substrates may be suitable, including for example a printed circuit board or any of a variety of semiconductor package substrates. The substrate includes at least one patterned electrically conductive layer supported by at least one dielectric layer; for simplicity in the illustration, the layers in the substrate are not shown in the Figs. The electrically conductive layer is connected to the bond pads, and is typically covered with a passivation layer (a solder mask, for example) except at the bond pads. The pedestals 438 are formed in contact with the respective bond pads; the pedestals need not necessarily have the same shape or dimensions as the bond pads, and may typically have a footprint larger than the bond pads. The die 14 has a front side 444 and a back side 440 and margins 443 (on the front side 444) and 441 (on the back side 441) at the edges (e.g., edge 442). The die 14 includes a conformal dielectric coating 449, which has openings exposing interconnect pads 128 arranged near the margin at the front side of the die 14. In the embodiments shown in the FIGs. the die 14 includes an as-provided die 414 having die pads at the margins which serve as the interconnect pads. In other embodiments the interconnect pads 128 are connected to die pads by rerouting, and in such embodiments the rerouting circuitry may optionally be covered by a passivation or a conformal coating, which has openings exposing the interconnect pads.

The interconnect terminals 129 are bonded to the interconnect pads 128, and extend beyond the die edge 442. The terminals may be, for example, tabs or ribbons; or they may be, for example, wires or flattened wires. The terminals may, for example, be thermo mechanically bonded to the interconnect pads. Wires or ribbons may be formed as in a standard wire bond or ribbon bond process and, if flattened wires are desired, projecting portions of the wires can be flattened by coining.

Die mount is initiated by orienting the die in relation to the substrate (for example, by means of a pick-and-place tool) and moving the die and the substrate toward one another as indicated by the arrow in FIG. 4. As the die 14 approaches the substrate 20, the projecting ends 430 of the terminals 129 contact the surfaces 439 of the pedestals 438, and then penetrate into the pedestals. FIG. 5 shows, at 52 an assembly having a die fully mounted on the substrate. The projecting ends 530 of the terminals are buried in the pedestals 538, which have yielded to the penetration of the terminal ends, while maintaining sufficient height.

Where a single die is to be mounted on the substrate, as shown in FIG. 5, the substrate may be sawed or punched, for example, to form a singulated assembly having substrate edges (e.g., 426) and substrate margins (e.g., 425, 427). The assembly may subsequently by molded. The substrate may be singulated before die mount, although in production it may be desirable to perform the die mount on a row or array of substrates, forming a row or array of assemblies, which are subsequently singulated. Singulated assemblies my then be molded; or, where the assemblies are formed in a row or array they may be molded or encapsulated prior to singulation.

Figure 6:
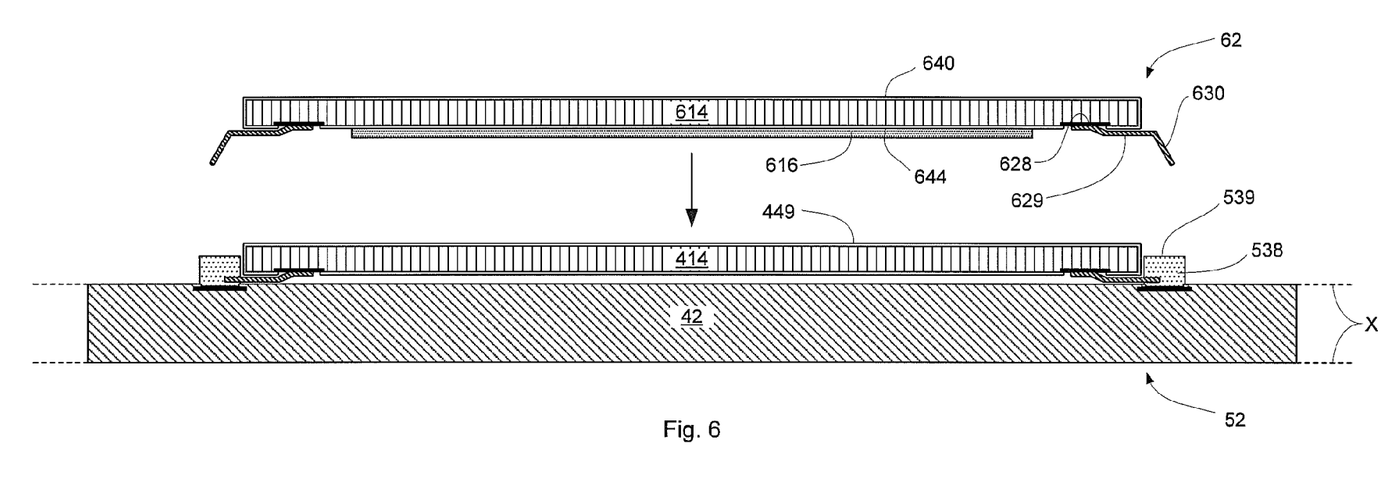
FIG. 6 is a diagrammatic sketch in a sectional view as in FIG. 5, showing a first die mounted on a substrate, and a second die to be mounted over the first die and electrically interconnected by way of interconnect pedestals according to an embodiment of the invention.
Figure 7:
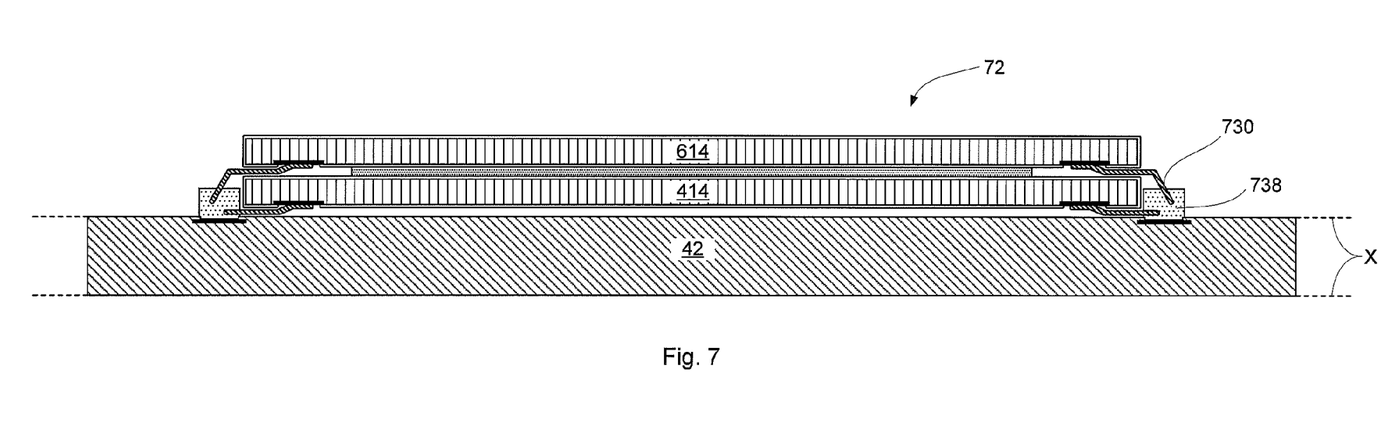
FIG. 7 is a diagrammatic sketch in a sectional view as indicated at 5-5 in FIG. 11, showing a first die mounted on a substrate, and a second die mounted on a first die, the first and second die being electrically interconnected by way of interconnect pedestals according to an embodiment of the invention.

Additional die may be mounted over the first die on the substrate, as shown in FIGS. 6 and 7. A second die 62 is provided, having a structure generally similar to that of the first die 14. Particularly in this embodiment the die 62 includes an as-provided die 614 having die pads at the margins which serve as the interconnect pads 628. Interconnect terminals 629 are bonded to the interconnect pads 628 and project beyond the die edge; the projecting portions 630 of the second die interconnect terminals 629 are optionally, as shown in this example, bent toward the pedestals. The second die 62 has a front side 644 and a back side 640. An adhesive layer 616 is provided on the front side 644 of the second die or on the back side 449 of the first die, to provide adhesion between the second die 62 and the back side 449 of the first die. The layer 616 may serve both as an affixative and as a spacer; or, the layer 616 may include a spacer member and adhesive layers; or, the layer 616 may be a spacer/adhesive, that is, an adhesive material containing spacers, such as glass or polymer spheres, having dimensions suitable to provide a standoff between the front side of the second die and the back side of the first die. In some embodiments the die interconnect terminals are not bent; as on the first die, they may project horizontally, so long as the pedestal height and die thickness permit good contact of the second die terminals with the pedestals. Similarly, so long as die thickness and pedestal height permit, additional die may be stacked over the second die and, where necessary, the terminals on upper die in the stack may be bent to provide good contact of the interconnect terminals with the pedestals.

Second die mount is initiated by orienting the second die in relation to the first die on the substrate (for example, by means of a pick-and-place tool) and moving the die and the substrate toward one another as indicated by the arrow in FIG. 6. As the die 62 approaches the assembly 52, the bent projecting ends 630 of the terminals 629 contact the surfaces 539 of the pedestals 538, and then penetrate into the pedestals. FIG. 7 shows, at 72 an assembly having a die fully mounted on the substrate. The projecting ends 730 of the terminals are buried in the pedestals 738, which have yielded to the penetration of the terminal ends, while maintaining sufficient form.

At this stage the assembly may be treated to cure the pedestal material, and the assemblies may be singulated and molded, or encapsulated and singulated, as described above.

Figure 8:
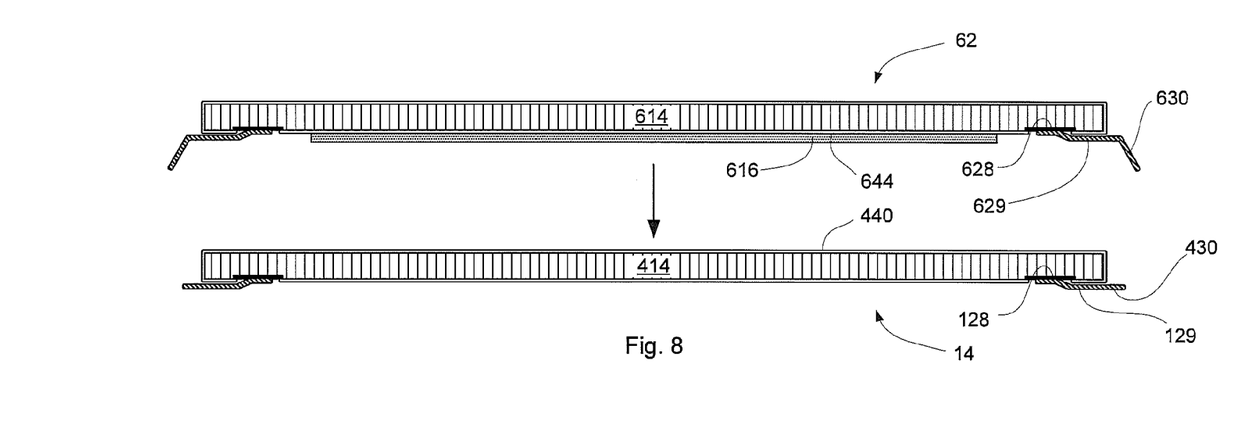
FIGS. 8 and 9 are diagrammatic sketches in a sectional view showing stages in construction of an assembly as in FIG. 7, according to another embodiment of the invention.
Figure 9:
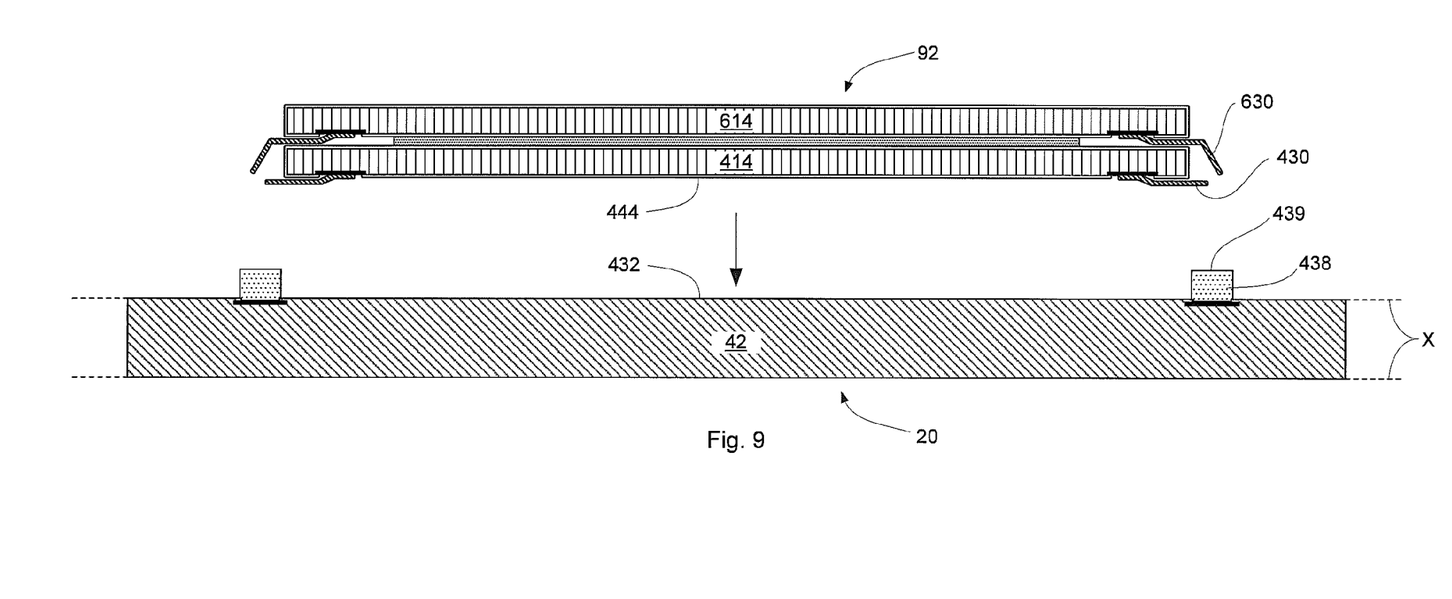

An alternative way of making a two-die stacked assembly is shown by way of example in FIGS. 8 and 9. In this approach, a second die 62 configured similarly to the second die 62 as shown in FIG. 6 is aligned with a first die 14 configured similarly to the first die 14 as shown in FIG. 4. The first and second die are moved toward one another as indicated by the arrow in FIG. 8, and allowed to adhere to form a two-die stack 92 as shown in FIG. 9. Then the two-die stack 92 is aligned with the substrate 20 and the two-die stack and the substrate are moved toward one another, so that the projecting portions 430, 630 of the terminals contact the pedestals surface 439 and then penetrate the pedestals 438.

Figure 10:
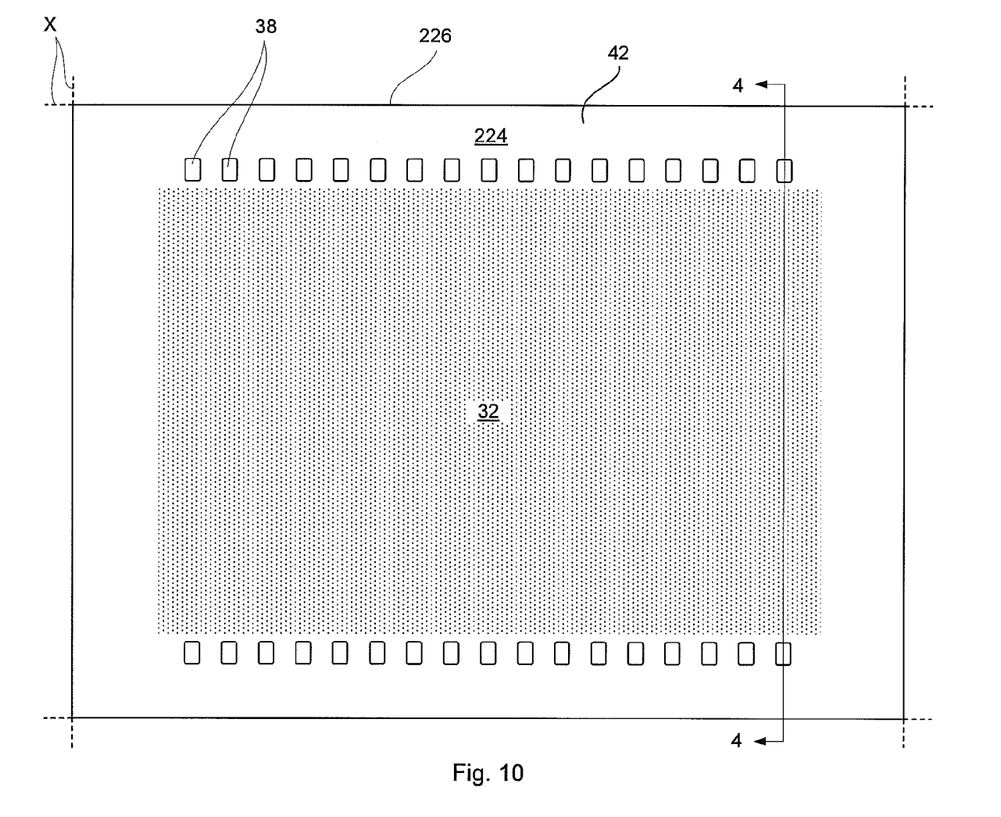
FIG. 10 is a diagrammatic sketch in a plan view showing electrical interconnect pedestals mounted on a substrate according to an embodiment of the invention.

The substrate according to an embodiment of the invention is shown by way of example in plan view in FIG. 10. The die footprint 32 is located on the die attach side 224 of the substrate 42. The pedestals 38 are formed at the bond pads, which in this example are arranged in a row along each of two opposite boundaries of the die footprint.

Figure 11:
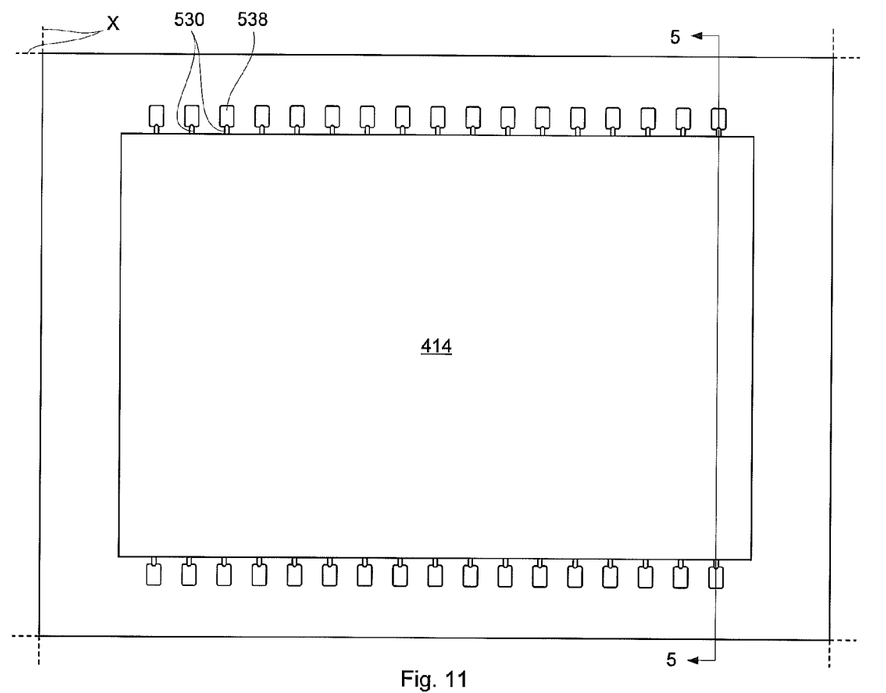
FIG. 11 is a diagrammatic sketch in a plan view showing a die mounted on a substrate and interconnected according to an embodiment of the invention.

FIG. 11 shows in plan view an assembly having a die 414 mounted on a substrate as in FIG. 10. The projecting portions 530 of the interconnect terminals are buried in the pedestals 538.

Figure 12:
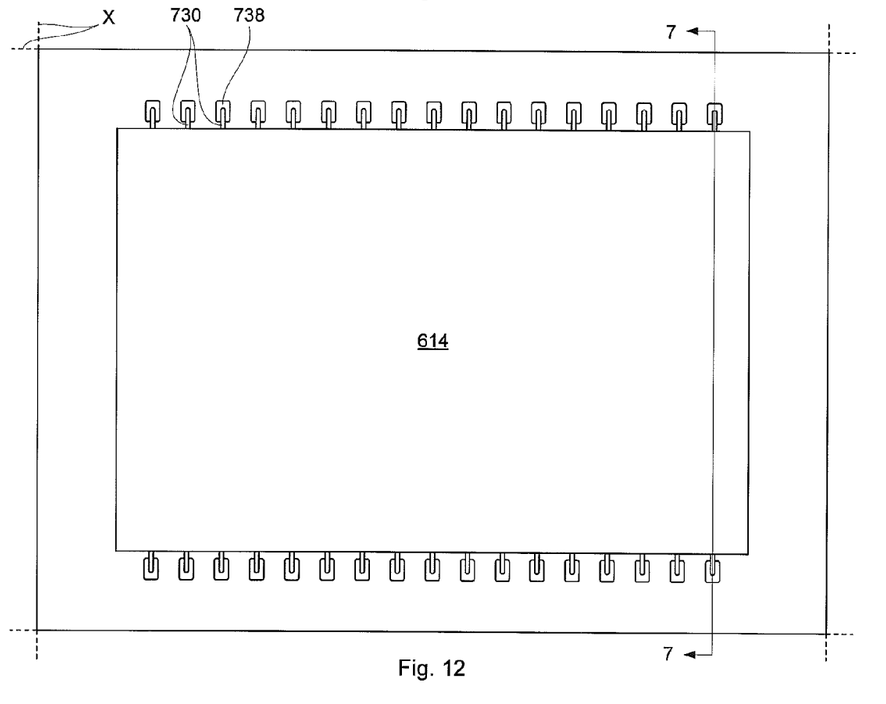
FIG. 12 is a diagrammatic sketch in a plan view showing two die mounted over a substrate and interconnected according to an embodiment of the invention.

FIG. 12 shows in plan view a two-die stack assembly having a second die 614 mounted over a first die (mounted on the substrate as in FIG. 11). The projecting portions 730 of the interconnect terminals are buried in the pedestals 738.

Other embodiments are within the following claims.

We claim:

1. A support for mounting an integrated circuit chip, comprising penetrable interconnect pedestals formed at bond sites on a die mount surface of the support, said penetrable pedestals lacking solder and being sufficiently firm such that said penetrable pedestals are configured to maintain a suitable height and form in a state of being penetrated by interconnect terminals of at least one component.

2. The support of claim 1 wherein the bond sites are arranged near at least one edge of the location of a footprint of a die to be mounted on the support.

3. The support of claim 1, comprising a package substrate.

4. The support of claim 1, comprising a leadframe.

5. The support of claim 1, comprising a circuit board.

6. The support of claim 1 wherein the bond sites comprise bond pads at the die mount surface of a substrate.

7. The support of claim 1 wherein the bond sites comprise bond pads at the die mount surface of a circuit board.

8. The support of claim 1 wherein the bond sites comprise connection sites on lead fingers of a leadframe.

9. The support of claim 1 wherein the pedestals comprise a curable or settable material, the pedestal material being electrically conductive when set or cured.

10. The support of claim 1 wherein the pedestals comprise a matrix containing an electrically conductive filler.

11. The support of claim 1, wherein the interconnect terminals are interconnect terminals of each of a plurality of stacked components, the interconnect terminals extending beyond edges of each of the plurality of stacked components.

12. The support of claim 11, wherein said penetrable pedestals are formed of a curable or settable material and are configured to be cured in a state of being penetrated by the interconnect terminals extending beyond edges of each of the plurality of stacked components.

13. An assembly comprising a plurality of stacked semiconductor die mounted to a support, the support having interconnect pedestals formed at bond sites, said pedestals lacking solder, and each die of the stacked semiconductor die having interconnect terminals projecting beyond a die edge and projecting into the pedestals.

14. The assembly of claim 13 wherein the pedestals comprise a matrix containing an electrically conductive filler.

15. The assembly of claim 14 wherein the matrix comprises a curable or settable material.

16. The assembly of claim 14 wherein the matrix comprises an organic polymer.

17. The assembly of claim 16 wherein the matrix comprises an epoxy.

18. The assembly of claim 14 wherein the electrically conductive filler is in particulate form.

19. The assembly of claim 14 wherein the electrically conductive filler comprises a particulate electrically conductive metal.

20. The assembly of claim 19 wherein the conductive filler comprises silver particles.

* * * * *